(12) United States Patent
    Fukuzawa

(10) Patent No.: US 9,559,718 B2
(45) Date of Patent: Jan. 31, 2017

(54) D/A CONVERSION CIRCUIT, OSCILLATOR, ELECTRONIC APPARATUS, AND MOVING OBJECT

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/013,132

(22) Filed: Feb. 2, 2016

(65) Prior Publication Data

US 2016/0226510 A1 Aug. 4, 2016

(30) Foreign Application Priority Data

Feb. 4, 2015 (JP) ................................. 2015-020198

(51) Int. Cl.
    *H03M 1/66* (2006.01)
    *H03M 1/76* (2006.01)
    *H01L 23/528* (2006.01)

(52) U.S. Cl.
    CPC .............. *H03M 1/76* (2013.01); *H01L 23/528* (2013.01); *H03M 1/765* (2013.01)

(58) Field of Classification Search
    CPC .............. H03M 1/76; H03M 1/66; H03B 5/36; H03B 5/04
    USPC ......................................... 341/155, 144, 154
    See application file for complete search history.

(56) References Cited

U.S. PATENT DOCUMENTS

| 6,937,178 | B1* | 8/2005 | Rempfer | H03M 1/0678 |
| | | | | 341/144 |
| 7,369,074 | B2 | 5/2008 | Miyata et al. | |
| 2002/0066912 | A1* | 6/2002 | Tsuchiya | H01L 27/0802 |
| | | | | 257/203 |
| 2005/0128112 | A1 | 6/2005 | Miyata et al. | |
| 2007/0085653 | A1* | 4/2007 | Shimizu | H01L 27/0802 |
| | | | | 338/128 |
| 2015/0023393 | A1* | 1/2015 | Britton | G01K 7/24 |
| | | | | 374/185 |
| 2015/0180410 | A1* | 6/2015 | Yamamoto | H03B 5/04 |
| | | | | 331/70 |
| 2015/0214836 | A1 | 7/2015 | Tsumura | |
| 2016/0211860 | A1* | 7/2016 | Isozaki | H03M 1/66 |

FOREIGN PATENT DOCUMENTS

| JP | 4629971 B2 | 2/2011 |
| JP | 4889397 B2 | 3/2012 |
| JP | 2014-059620 A | 4/2014 |

* cited by examiner

*Primary Examiner* — Peguy Jean Pierre
(74) *Attorney, Agent, or Firm* — Harness, Dickey & Pierce, P.L.C.

(57) ABSTRACT

A D/A conversion circuit includes a plurality of resistors that are formed on a semiconductor substrate and that are connected in series to each other and a plurality of switches that are connected to the plurality of resistors, respectively, in which the plurality of resistors are configured using resistive element and a plurality of contacts that are provided to the resistive element, in which the plurality of switches are arranged side by side along a first direction when the semiconductor substrate is viewed from above, in which distances in the first direction between the plurality of contacts are equal to each other, and in which lengths in a second direction that is perpendicular to the first direction, of the plurality of resistors are unequal to each other.

20 Claims, 8 Drawing Sheets

D/A CONVERSION CIRCUIT, OSCILLATOR, ELECTRONIC APPARATUS, AND MOVING OBJECT

BACKGROUND

1. Technical Field

The present invention relates to a D/A conversion circuit, an oscillator, an electronic apparatus, and a moving object.

2. Related Art

In a case where a D/A conversion circuit that is a type of resistor-caused voltage division is formed on a semiconductor substrate, for example, along a longitudinal direction of a resistive element with a predetermined width, a plurality of MOS switches are arranged adjacent to a resistive element, at the minimum distances allowed by a layout design rule, and distances (contact pitches) in a longitudinal direction of a plurality of contacts that are provided to the resistive element in order to form a plurality of division voltage resistors that have equal resistance values are set to be constant in accordance with arrangement of the plurality of MOS switches. Thus, each of the division voltage resistors and the MOS switch can be efficiently wired and a reduced area can be realized.

On the other hand, in the D/A conversion circuit that is the type of resistor-caused voltage division, in a case where a relationship between digital data that is input and an analog voltage that is output is desired to have intentional nonlinearity, because resistance values of the division voltage resistors are not equal to each other, there occurs a need to change a contact pitch for every division voltage resistor in order to form a plurality of division voltage resistors having different resistance values on the resistive element with the predetermined width. In such a case, the plurality of MOS switches cannot be arranged at the minimum distances and an unnecessary area occurs in an arrangement area of the MOS switch. Alternatively, when the plurality of MOS switches are arranged at the minimum distances, a wiring area for connecting between each contact and each MOS switch on the resistive element increases and a reduced area is difficult to realize. Particularly, the greater a difference (a ratio) between each of the division voltage resistors, the greater a difference in distance between the contacts on the resistive element. Thus, the unnecessary area or the wiring area that is described increases.

In contrast, JP-A-2014-59620 discloses a voltage division circuit, which results from arranging a plurality of resistive elements, each of which constitutes a unit resistor, side by side in a unidirectional manner, connecting the resistive elements (the unit resistors) in parallel or in series to each other and thus forming a plurality of division voltage resistors that have different resistance value. Because, with this configuration of the division voltage resistor in the division voltage circuit, lengths in the longitudinal direction, of all resistive areas can be shortened by lengthening lengths in the transverse direction, if the configuration of the division voltage resistor is applied to a nonlinear D/A conversion circuit, a difference in contact pitch between the division voltage resistors can be reduced.

However, in the division voltage circuit disclosed in JP-A-2014-59620, because a plurality of unit resistors are arranged side by side in a unidirectional manner, an unnecessary area almost does not occur in the resistive area, but the difference in contact pitch between the division voltage resistors cannot be set to be zero. Therefore, although the configuration of the division voltage resistor is applied to the voltage division circuit, with a characteristic of the nonlinear D/A conversion circuit, an occurrence of the unnecessary area described above or an increase in the wiring area cannot be suppressed sufficiently, and, in some cases, a reduced area cannot be realized.

SUMMARY

An advantage of some aspects of the invention is to provide a D/A conversion circuit that is capable of having a reduced area while having nonlinearity in terms of an input and output characteristic. Furthermore, another advantage of some aspects of the invention is to provide an oscillator, an electronic apparatus, and a moving object which use the D/A conversion circuit.

The invention can be implemented as the following forms or application examples.

APPLICATION EXAMPLE 1

A D/A conversion circuit according to this application example includes: a plurality of resistors that are connected in series to each other; and a plurality of switches that are respectively connected to the plurality of resistors, the plurality of resistors and the plurality of switches being formed on a semiconductor substrate, in which each of the plurality of resistors is configured using a resistive element and a plurality of contacts that are provided to the resistive element, in which, when the semiconductor substrate is viewed from above, the plurality of switches are arranged side by side along a first direction, distances in the first direction between the plurality of contacts are equal to each other, and lengths in a second direction that is perpendicular to the first direction, of the plurality of resistors are unequal to each other.

The length in the second direction, for example, is the shortest length in the second direction between an end of the contact or an end of the resistive element and an end of the contact or an end of a resistive element R, and, in a case where the plurality of contacts are short-circuited with the same wiring, lengths between short-circuit paths are not counted.

According to the D/A conversion circuit of this application example, distances in the first direction between the plurality of contacts that are provided to the resistive element are equal to each other, and thus an area necessary for wiring for connections between the plurality of resistors and the plurality of switches can be reduced. Furthermore, the lengths in the second direction, of the plurality of resistors that are provided to the resistive element are unequal to each other, and thus resistance values of the plurality of resistors can be made to be different from each other. Therefore, according to the application example, the D/A conversion circuit that is capable of having a reduced area while at the same time having nonlinearity in terms of an input and output characteristic can be realized.

APPLICATION EXAMPLE 2

In the D/A conversion circuit according to the application example, each of the plurality of switches may be a MOS transistor.

APPLICATION EXAMPLE 3

In the D/A conversion circuit according to the application example, both ends of each of the plurality of resistors may be set to be the contact that is connected to an electrode of one switch of the two switches which are arranged adjacent to each other, and the contact that is connected to an electrode of the other switch.

APPLICATION EXAMPLE 4

In the D/A conversion circuit according to the application example, when the semiconductor substrate is viewed from above, at least one of the plurality of resistors may be a first type resistor that has bending, and at least another one of the plurality of resistors may be a second type resistor that does not have bending.

According to the D/A conversion circuit of the application example, while the lengths in the first direction are the same, a resistor that has a relatively high resistance value is configured as the first type resistor and a resistor that has a relatively low resistance value is configured as the second type resistor, and thus, the plurality of resistors that have different resistance values can be realized with a small arrangement area. Therefore, according the application example, the D/A conversion circuit that is capable of having a reduced area while at the same time having nonlinearity in terms of an input and output characteristic can be realized.

APPLICATION EXAMPLE 5

In the D/A conversion circuit according to the application example, when the semiconductor substrate is viewed from above, if a length in the second direction, of a resistor that, among the first type resistors, has a maximum resistance value is set to $L1_{max}$ and a length in the second direction, of a resistor that, among the second type resistors, has a minimum resistance value is set to $W2_{max}$, $0.5 \leq L1_{max}/W2_{max} \leq 2$ may be established.

According to the D/A conversion circuit of the application example, because the length in the second direction, the arrangement area of the first type resistance and the length in the second direction, of the arrangement area of the second type resistor are uniform to some extent, an unnecessary area can be reduced and thus the arrangement areas of the plurality of resistors can be reduced.

APPLICATION EXAMPLE 6

In the D/A conversion circuit according to the application example, when the semiconductor substrate is viewed from above, each of the plurality of resistors may be a resistor that does not have bending.

According to the application example, because the lengths in the second direction are made to be different from each other while the lengths in the first direction are the same and thus the plurality of resistors can be configured that have different resistance values, the D/A conversion circuit that is capable of having a reduced area while at the same time having the nonlinearity in terms of the input and output characteristic can be realized.

APPLICATION EXAMPLE 7

An oscillator according to this application example includes the D/A conversion circuit according to any one of the application examples.

According to the oscillator of the application example, because the D/A conversion circuit that is capable of having a reduced area while at the same time having the nonlinearity in terms of the input and output characteristic is used, for example, the small-sized digital control-type oscillator can be realized that has a wide frequency variable range.

APPLICATION EXAMPLE 8

An electronic apparatus according to this application example includes the D/A conversion circuit according to any one of the application examples.

APPLICATION EXAMPLE 9

A moving object according to this application example includes the D/A conversion circuit according to any one of the application examples.

According to these application examples, because the D/A conversion circuit that is capable of having a reduced area while at the same time having the nonlinearity in terms of the input and output characteristic is used, for example, the electronic apparatus and the moving object that have high reliability can be realized at a low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Suitable embodiments of the invention will be described in detail below. Moreover, the embodiments that will be described below do not unjustly impose any limitation on contents of the invention that are described in the appended claims. Furthermore, all configurations that will be described below are not necessarily essential requirements for the invention.

1. D/A Conversion Circuit 1-1. First Embodiment

Figure 1:
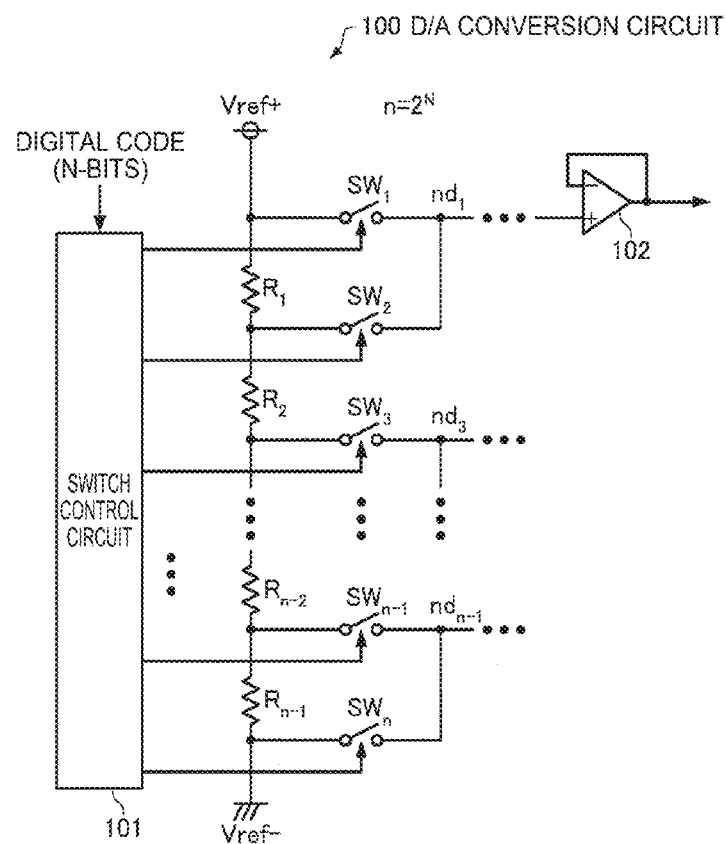
FIG. 1 is a diagram illustrating a configuration of a D/A conversion circuit according to an embodiment.

FIG. 1 is a diagram illustrating a configuration of a D/A conversion circuit. A D/A conversion circuit 100 according to the first embodiment is configured to include n ($=2^N$)−1 resistors $R_1$ to $R_{n-1}$, n switches $SW_1$ to $SW_n$, a switch control circuit 101 and an arithmetic operation amplifier 102, which are formed on a semiconductor substrate.

The n−1 resistors $R_1$ to $R_{n-1}$ are formed on the semiconductor substrate and are connected in series between a supply line of a reference voltage Vref+ at the high potential side and a supply line (for example, a ground line) of a reference voltage Vref− at the low potential side.

Both ends of each resistor $R_k$ (k=1 to n−1) are connected to one end of the switch $SW_k$ and one end of the switch $SW_{k+1}$, respectively, and the other end of the switch $SW_k$ and the other end of the switch $SW_{k+1}$ are connected to each other.

Each of connection nodes $nd_I$ between the other end of each of the switches SWI (I=1, 3, . . . , n−1) and the other end of each of the switches $SW_{I+1}$ is connected to a non-inversion input terminal (a + terminal) of the arithmetic operation amplifier 102 through at least one switch (not illustrated).

The arithmetic operation amplifier 102 functions as a voltage follower of which an output terminal and a non-inversion input terminal (a − terminal) are connected to each other and which supplies a voltage of the non-inversion input terminal (a + terminal) to the output terminal.

An N-bit digital code is input into the switch control circuit 101, and, according to the N-bit digital code, the switch control circuit 101 performs control in such a manner that switches $SW_I$ (I=1, 3, . . . n−1) are in an ON state at the same time and the switches $SW_{I+1}$ are in an OFF state at the same time and in such a manner that the switches $SW_I$ are in the OFF state at the same time and the switches $SW_{I+1}$ are in the ON state at the same time. Thus, each of the nodes $nd_I$ (I=1, 3, . . . , n−1) is electrically connected to any one of a terminal at the high potential side, of the resistor $R_1$ and a terminal at the low potential side. Furthermore, the switch control circuit 101 controls a group of switches that are not illustrated, in such a manner that only any one of the nodes $nd_I$ is electrically connected to the non-inversion input terminal (the + terminal) of the arithmetic operation amplifier 102. That is, the switch control circuit 101 selects any one voltage of n ($=2^N$) types of voltages that result from voltage division with the resistors $R_1$ to $R_{n-1}$ between the reference voltage Vref+ and the reference voltage Vref−, and outputs the selected voltage to the non-inversion input terminal (the + terminal) of the arithmetic operation amplifier 102.

A switch $SW_m$ (m=1 to n) may be a MOS transistor. In this case, one of a source electrode and a drain electrode of the MOS transistor is connected to any one of the resistors $R_k$ (k=1 to n−1), and the other is connected to any one of the nodes $nd_I$ (I=1, 3, . . . , n−1). Furthermore, a control signal from the switch control circuit 101 is supplied to a gate electrode of each MOS transistor.

A D/A conversion circuit 100, which is configured in this manner, according to the present embodiment, is a D/A conversion circuit that is a type of resistor-caused voltage division (also referred to as a voltage distribution type, a resistor string type, or a voltage potentiometer type), and outputs $2^N$ types of voltages in accordance with the N-bit digital code value that is input.

Moreover, control may be performed in such a manner that each of the nodes $nd_I$ (I=1, 3, . . . , n−1) is connected directly to the non-inversion input terminal (the + terminal) of the arithmetic operation amplifier 102 and that according to the N-bit digital code value, the switch control circuit 101 causes any one switch of the switch $SW_m$ (m=1 to n) to be in the ON state and causes all other switches to be in the OFF state.

According to the present embodiment, resistance values of at least two of the n−1 resistors $R_1$ to $R_{n-1}$ are made to be different from each other, and an output voltage of the D/A conversion circuit 100 is nonlinear with respect to the digital code that is input. One example of an input and output characteristic of the D/A conversion circuit 100 is illustrated in FIG. 2.

Figure 2:
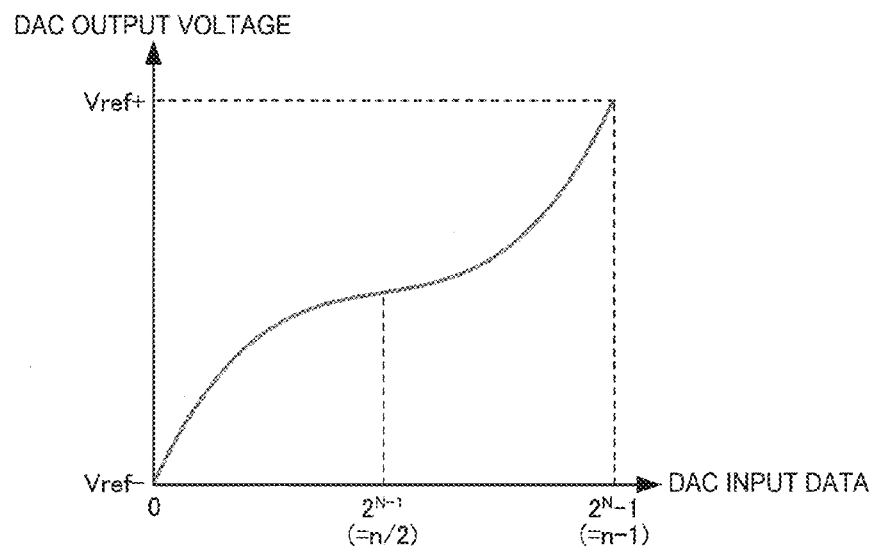
FIG. 2 is a diagram illustrating one example of an input and output characteristic of the D/A conversion circuit according to the present embodiment.

In an example in FIG. 2, in a range in which input data (an N-bit digital code) is smaller than $2^{N-1}$ (=n/2) that is a median value, an amount (a slope) of increase in the output voltage decreases monotonously with respect to an amount of increase in the value of the input data, and in a range in which the input data is greater than $2^{N-1}$, the amount (the slope) of increase in the output voltage increases monotonously with respect to the amount of increase in the value of the input data. For example, the D/A conversion circuit 100 that has this input and output characteristic satisfies a relationship between resistance values, that is, a resistance value of a resistor $R_1$>a resistance value of a resistor $R_2$> . . . a resistance value of a resistor $R_{n/2-1}$>a resistance value of a resistor $R_{n/2}$<a resistance value of a resistor $R_{n/2+1}$< . . . <a resistance value of a resistor $R_{n-2}$<a resistance value of a resistor $R_{n-1}$. The resistance value decreases monotonously from the resistor $R_1$ to the resistor $R_{n/2}$, and the resistance value increases monotonously from the resistor $R_{n/2}$ to the resistor $R_{n-1}$.

Figure 3:
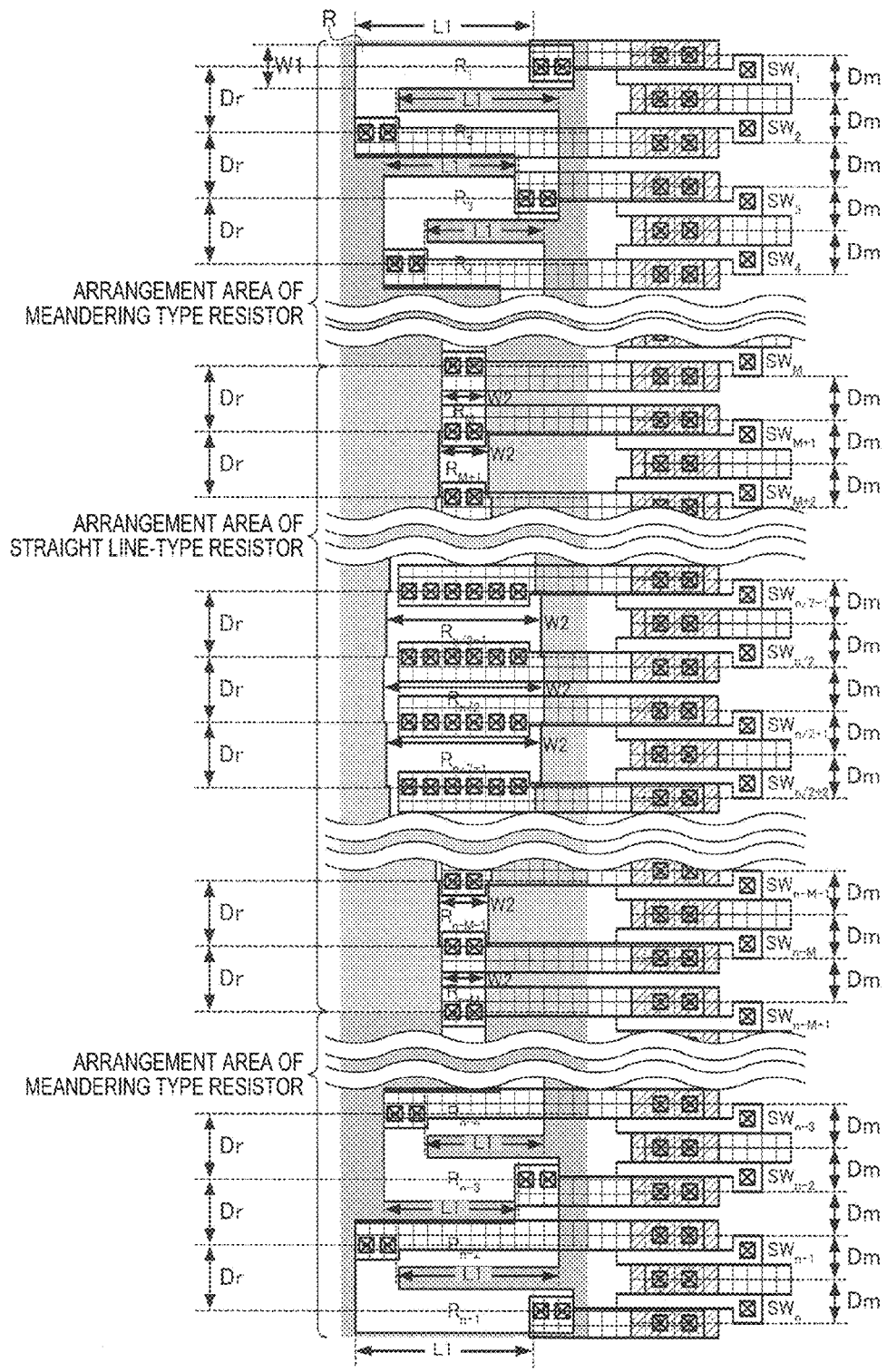
FIG. 3 is a diagram illustrating one example of a layout of a D/A conversion circuit according to a first embodiment.

FIG. 3 is a diagram illustrating one example of a layout (a layout of the semiconductor substrate when viewed from above) on the semiconductor substrate of the D/A conversion circuit 100 according to the first embodiment, which has a nonlinear input and output characteristic as illustrated in FIG. 2. Moreover, in FIG. 3, only one or several resistors and switches among the constituent elements in FIG. 1 are illustrated, and illustrations of other resistors or switches, the switch control circuit 101, and the arithmetic operation amplifier 102 are omitted.

As illustrated in FIG. 3, in the D/A conversion circuit 100 according to the present embodiment, the n switches $SW_1$ to $SW_n$ (one example of a plurality of switches) are MOS transistors, respectively, and the n switches $SW_1$ to $SW_n$ are arranged side by side along a first direction (a vertical direction in FIG. 3). In order to minimize an arrangement area of the n switches $SW_1$ to $SW_n$ (the MOS transistors), a drain or a source is common to two adjacent switches such as the switch $SW_1$ and the switch $SW_2$, and the switch $SW_3$ and the switch $SW_4$, and distances (a distance between sources or drains) between two adjacent switches such as the switch $SW_2$ and the switch $SW_3$, and the switch $SW_4$ and the switch $SW_5$ are set to be the minimum distances allowed by a layout design rule. When the n switches $SW_1$ to $SW_n$ (the MOS transistors) are arranged in this manner, for example, distances (contact pitches) Dm in the first direction between each of the plurality of contacts that are provided to the sources or the drains of the switches $SW_1$ to $SW_n$ (the MOS transistors) are equal (the minimum distances allowed by the layout design rule) to each other.

The n−1 resistors $R_1$ to $R_{n-1}$ (one example of a plurality of resistors) are configured using a resistive element R (which, for example, is formed of polysilicon) and a plurality of contacts that are provided to the resistive element R. Both ends of each resistor $R_k$ are set to be a contact that is connected to an electrode (a source or a drain that is not common) of one switch $SW_k$ of two switches $SW_k$ and switch$_{k+1}$, and a contact that is connected to an electrode (a source or a drain that is not common) of the other switch $SW_{k+1}$. In FIG. 3, a portion of the resistive element R that is equivalent to each resistor $R_k$ is given the code "$R_k$".

According to the present embodiment, distances (contact pitches) Dr in the first direction between each of the plurality of contacts that are provided to the resistive element R are equal to each other (are the same). Because both ends of each resistor $R_k$ (k=1 to n−1) are connected to an electrode of the switch $SW_k$ and an electrode of the switch $SW_{k+1}$, respectively, if Dr=1.5 Dm is established, a connection can be made most efficiently with wiring in an almost straight line.

Furthermore, according to the present embodiment, at least one of the n−1 resistors $R_1$ to $R_{n-1}$ is a meandering type (one example of a first type) resistor that has bending, and at least another one of the n−1 resistors $R_1$ to $R_{n-1}$ is a straight line-type (one example of a second type) resistor that does not have bending. With the resistive element R that is arranged on the semiconductor substrate, the resistors $R_1$ to $R_{n-1}$ are configured to have the same material (for example, polysilicon) and the same thickness, consequently the resistance value of each resistor is proportional to a ratio L/W between a length (L) and a width (W) of an electric current path. As illustrated in FIG. 3, in a meandering type resistor, L≅a length L1 in a second direction+a contact pitch Dr, and W≅a width W1 of the resistive element R. Furthermore, in a straight line-type resistor, L≅the contact pitch Dr, and W≅a width W2 of the resistive element R. Therefore, according to the present embodiment, lengths (L1 or W2) in the second direction (the horizontal direction in FIG. 3), which is perpendicular to the first direction of the n−1 resistors $R_1$ to $R_{n-1}$ that are provided to the resistive element R, are unequal to each other.

Moreover, according to the present embodiment, the length in the second direction that is perpendicular to the first direction of the resistors $R_1$ to $R_{n-1}$ refers to the shortest length in the second direction between one end of the contact or one end of the resistive element R and the other end of the contact or the other end of the resistive element R.

The contact pitches Dr are equal to each other (are the same), the meandering type resistor L is greater than the straight line-type resistor L. Furthermore, while W of the meandering type resistor is necessarily smaller than the contact pitch Dr, W of the straight line-type resistor can be set to be greater than the contact pitch Dr. Therefore, the resistor that has a great resistance value is set to be the meandering type resistor, and the resistor that has a small resistance value is set to be the straight line-type resistor, and thus it is possible to reduce an arrangement area (an arrangement area of all resistors) of the resistive element R. As described above, in the D/A conversion circuit 100 that has the input and output characteristic that is illustrated in FIG. 2, the resistance value decreases monotonously from the resistor $R_1$ to the resistor $R_{n/2}$, and the resistance value increases monotonously from the resistor $R_{n/2}$ to the resistor $R_{n-1}$. Therefore, the resistor at the side that is close to the resistor $R_1$ or the resistor $R_{n-1}$ is set to be a meandering type, and the resistor at the side that is close to the resistor $R_{n/2}$ is set to be a straight line type. Thus, the arrangement area of the resistive element R can be reduced.

In an example in FIG. 3, all of the resistor $R_1$ to the resistor $R_{M-1}$ are the meandering type resistors, L1 decreases monotonously from the resistor $R_{M-1}$ to the resistor $R_{M-1}$, and L1 of the resistor $R_{M-1}$ is the minimum value. Moreover, W1's of the resistor $R_1$ to the resistor $R_{M-1}$ may be the same, and may not be the same. Furthermore, all of the resistor $R_M$ to the resistor $R_{n-M}$ are the straight line-type resistors, W2 increases monotonously from the resistor $R_N$ to the resistor $R_{n-M}$, W2 of the resistor $R_{n/2}$ is the maximum value, and W2 decreases monotonously from the resistor $R_{n/2}$ to the resistor $R_{n-M}$. Furthermore, all of the resistor $R_{n-M+1}$ to the resistor $R_{n-1}$ are the meandering type resistors, L1 increases monotonously starting from the resistor $R_{n-M+1}$, and L1 of the resistor $R_{n-1}$ is the maximum value. Furthermore, W/L of the resistor $R_M$ is smaller than the resistor $R_{M-1}$, and W/L of the resistor $R_{n-M+1}$ is greater than the W/L of the resistor $R_{n-N}$. Therefore, a resistance value of the resistor $R_1$ or a resistance value of the resistor $R_{n-1}$ is the maximum value, and a resistance value of the resistor $R_{n/2}$ is the minimum value.

At this point, when a sheet resistance value of the resistive element R is defined as Runit, and the minimum value of a width W2 of the resistive element R is defined as W2$_{min}$, the width W2 of the resistive element R in the straight line-type resistor with a resistance value r, for example, is calculated using Equation (1).

$$W2 = \text{MAX}\left[\frac{Runit}{r} \cdot Dr, W2_{min}\right] \quad (1)$$

Additionally, when the maximum value of a width W1 of the resistance element R in the meandering type resistor is defined as W1$_{max}$, the maximum value of W2 (a length W2 in the second direction, of a resistor of which the resistance value is the minimum value, among the straight line-type resistors) is defined as W2$_{max}$, the width W1 of the resistive element R and the length L1 in the second direction in the meandering type resistor with the resistance value r are calculated using Equation (2) and Equation (3), respectively.

$$W1 = \text{MIN}\left[\text{MAX}\left[\frac{Runit}{r} \cdot (Dr + W2_{max}), W2_{min}\right], W1_{max}\right] \quad (2)$$

$$L1 = \frac{r}{Runit} \cdot W1 - Dr \quad (3)$$

Moreover, Runit, W2$_{min}$, and W1$_{max}$ are values in a manufacturing processing of a semiconductor circuit (IC) that includes the D/A conversion circuit 100.

Because a length in the first direction, of the arrangement area (the arrangement area of all the resistors) of the resistive element R is determined by the contact pitch Dr, the smaller the length in the second direction, of the arrangement area of the resistive element R, the smaller the arrangement area of the resistive element R. The length in the second direction, of the resistive element R is determined by the greatest of a length in the second direction, of an arrangement area of the meandering type resistor and a length in the second direction, of an arrangement area of the straight line-type resistor. Then, when the maximum value of L1 (the length L1 in the second direction, of a resistor of which a resistance value is the maximum value among the meandering type resistors) is defined as $L1_{max}$, the length in the second direction, of the arrangement area of the meandering type resistor is approximately $L1_{max}$, and the length in the second direction, of the arrangement area of the straight line-type resistor is approximately $W2_{max}$. Therefore, it is preferable that a ratio between $L1_{max}$ and $W2_{max}$ approaches 1. If at least $0.5 \leq L1_{max}/W2_{max} \leq 2$ is satisfied, the length in the second direction, of the arrangement area of the meandering type resistor and the length in the second direction, of the arrangement area of the straight line-type resistor are uniform to some extent and an unnecessary area is reduced. Thus, the arrangement area (the arrangement area of all the resistors) of the resistive element R can be reduced.

As described above, with the D/A conversion circuit 100 according to the first embodiment, the distances Dr in the first direction between each of the plurality of contacts that are provided to the resistive element R are equal to each other, and areas necessary for wiring for connections between the n−1 resistors $R_1$ to $R_{n-1}$ and the n switches $S_1$ to $SW_n$ can be reduced. Furthermore, while the lengths Dr in the first direction are the same, a resistor that has a relatively high resistance value is configured as the meandering type resistor and a resistor that has a relatively low resistance value is configured as the straight line-type resistor. Thus, the n−1 resistors $R_1$ to $R_{n-1}$ that have different resistance values can be realized with a small arrangement area. Therefore, the D/A conversion circuit 100 can be realized that is capable of having a reduced area while at the same time having the nonlinearity in terms of the input and output characteristic.

1-2. Second Embodiment

Figure 4:
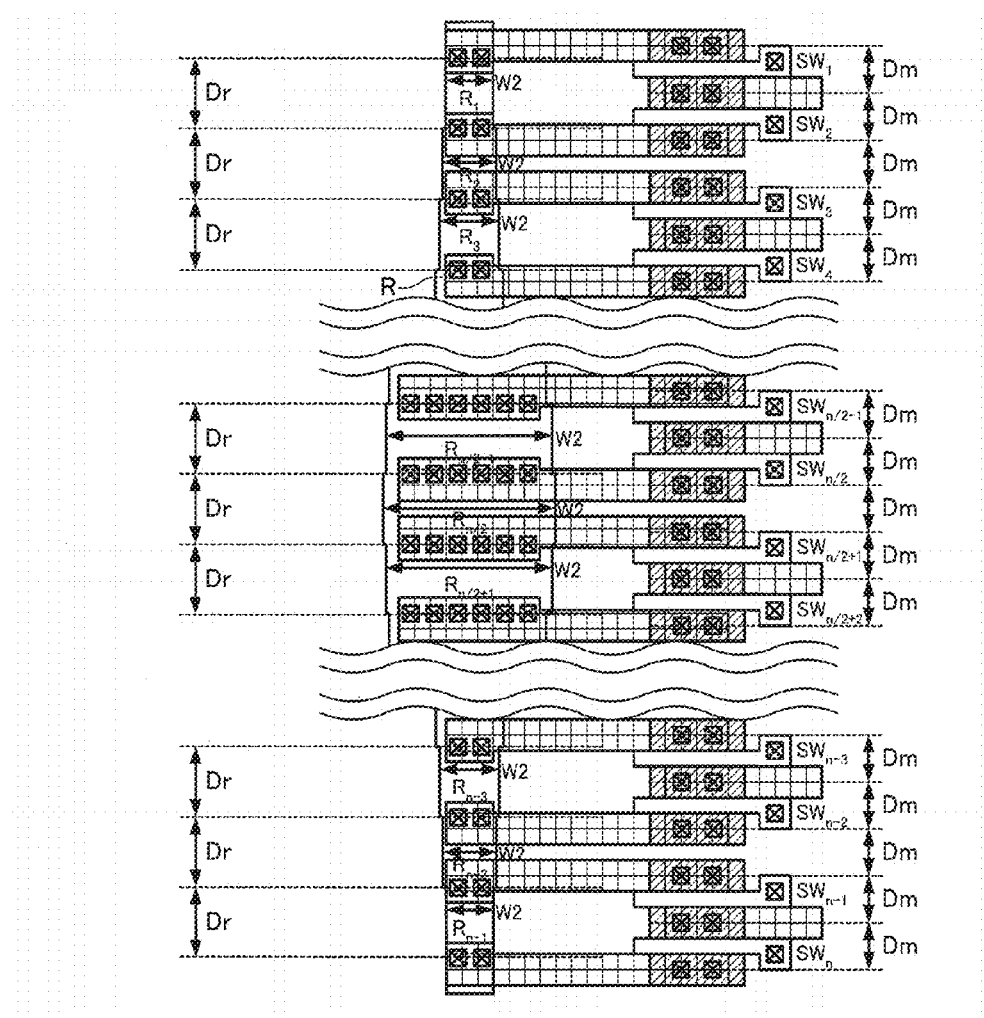
FIG. 4 is a diagram illustrating one example of a layout of a D/A conversion circuit according to a second embodiment.

A D/A conversion circuit according to a second embodiment has the same circuit configuration as that according to the first embodiment (FIG. 1), but has a different layout on the semiconductor substrate than that according to the first embodiment. FIG. 4 is a diagram illustrating one example of a layout (a layout on the semiconductor substrate when viewed from above) on the semiconductor substrate of the D/A conversion circuit 100 according to the second embodiment, which has the nonlinearity input and output characteristic as illustrated in FIG. 2. Moreover, in FIG. 4, only one or several resistors and switches among the constituent elements in FIG. 1 are illustrated, and illustrations of other resistors or switches, the switch control circuit 101, and the arithmetic operation amplifier 102 are omitted. In FIG. 4, the arrangement of the n switches $SW_1$ to $SW_n$ (the MOS transistors) is the same as in FIG. 3. For example, the distances (the contact pitches) Dm in the first direction (the vertical direction in FIG. 4) between each of the plurality of contacts that are provided to the sources or the drains of the switches $SW_1$ to $SW_n$ (the MOS transistors) are equal (minimum distances that are allowed by the layout design rule) to each other.

According to the embodiment, the distances Dr in the first direction, of a plurality of contacts that are provided to the resistive element R are equal to each other (are the same) as is the case with the first embodiment. Because both ends of each resistor $R_k$ (k=1 to n−1) are connected to an electrode of the switch $SW_k$ and an electrode of the switch $SW_{k+1}$, respectively, if Dr=1.5 Dm is established, a connection can be made most efficiently with wiring in an almost straight line.

Furthermore, according to the present embodiment, all the n−1 resistors $R_1$ to $R_{n-1}$ are the straight line-type resistors that have no bending. As illustrated in FIG. 4, in each resistor, length L of the electric current path≅contact pitch Dr, and width W of the electric current path≅width W2 of the resistive element R. Therefore, according to the present embodiment, the lengths (W2) in the second direction (the horizontal direction in FIG. 4) that is perpendicular to the first embodiment of the n−1 resistors $R_1$ to $R_{n-1}$ that are provided to the resistive element R are unequal to each other.

As described above, in the D/A conversion circuit 100 that has the input and output characteristic that is illustrated in FIG. 2, the resistance value decreases monotonously from the resistor $R_1$ to the resistor $R_{n/2}$, and the resistance value increases monotonously from the resistor $R_{n/2}$ to the resistor $R_{n-1}$. In the example in FIG. 3, all of the resistor $R_1$ to the resistor $R_{n-1}$ are the straight line-type resistors, W2 increases monotonously from the resistor $R_1$ to the resistor $R_{n/2}$, W2 of the resistor $R_{n/2}$ is the maximum value, and W2 decreases monotonously from the resistor $R_{n/2}$ to the resistor $R_{n-1}$. Therefore, the resistance value of the resistor $R_1$ or the resistance value of the resistor $R_{n-1}$ is the maximum value, and the resistance value of the resistor $R_{n/2}$ is the minimum value. The width W2 of the resistive element R in the straight line-type resistor with resistance value r, for example, is calculated using Equation (1).

As described above, with the D/A conversion circuit 100 according to the first embodiment, the distances Dr in the first direction between each of the plurality of contacts that are provided to the resistive element R are equal to each other, and areas necessary for the wiring for the connections between the n−1 resistors $R_1$ to $R_{n-1}$ and the n switches $S_1$ to $SW_n$ can be reduced. Furthermore, the lengths W2 in the second direction are made to be different from each other while at the same time the lengths in the first direction are the same. Thus, the n−1 resistors $R_1$ to $R_{n-1}$ that have different resistance values can be configured. Therefore, the D/A conversion circuit 100 can be realized that is capable of having a reduced area while at the same time having the nonlinearity in terms of the input and output characteristic.

1-3. Modification Example

Figure 5:
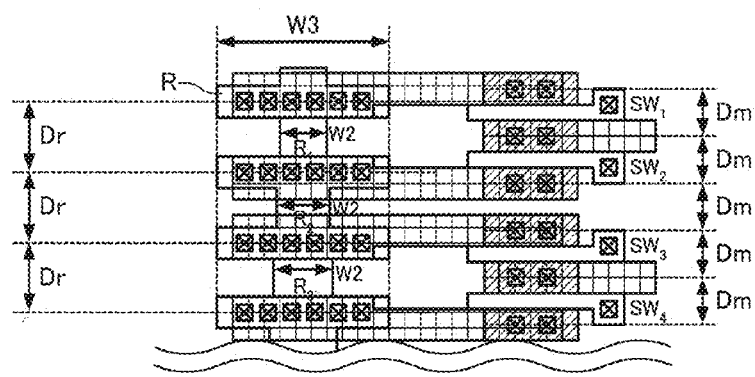
FIG. 5 is a diagram illustrating one example of a layout of a D/A conversion circuit in a modification example.

Various modifications to an oscillator 1 according to the first embodiment or the second embodiment are possible. According to each of the embodiments, which are described above, the length in the second direction that is perpendicular to the first direction of the resistors $R_1$ to $R_{n-1}$ refers to the shortest length in the second direction between one end of the contact or one end of the resistive element R and the other end of the contact or the other end of the resistive element R. When plural contacts are short-circuited by the same wiring, the distance between the short circuit paths is not counted. Therefore, for example, according to the first embodiment and the second embodiment that are described above, as illustrated in FIG. 5, although lengths W3 in the second direction (the horizontal direction in FIG. 5), of the resistive element R of the contact portion are equal to each other (the same), the shortest lengths W2 in the second direction, between the both ends of the resistance element R may be unequal to each other.

Figure 6:
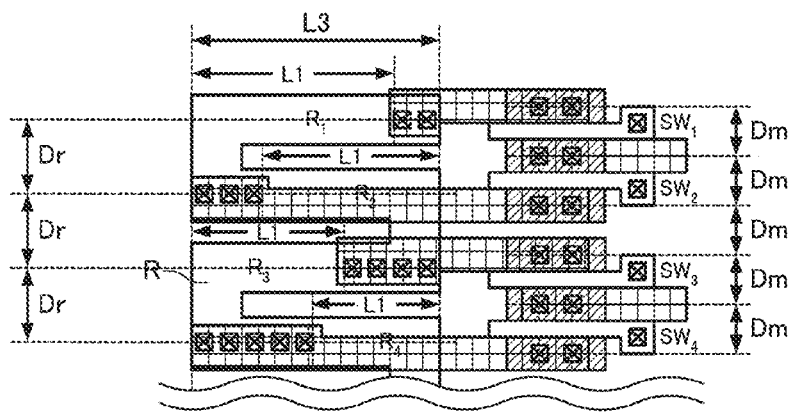
FIG. 6 is a diagram illustrating one example of a layout of a D/A conversion circuit in a modification example.

Furthermore, for example, according to the first embodiment described above, as illustrated in FIG. 6, although widths L3 in the second direction (the horizontal direction in FIG. 6), of the resistive element R are equal to each other (the same), in the meandering type resistor, the numbers of contacts are unequal to each other, and thus the shortest lengths L1 in the second direction between the end of the contact and the end of the resistive element R may be unequal to each other.

Figure 7:
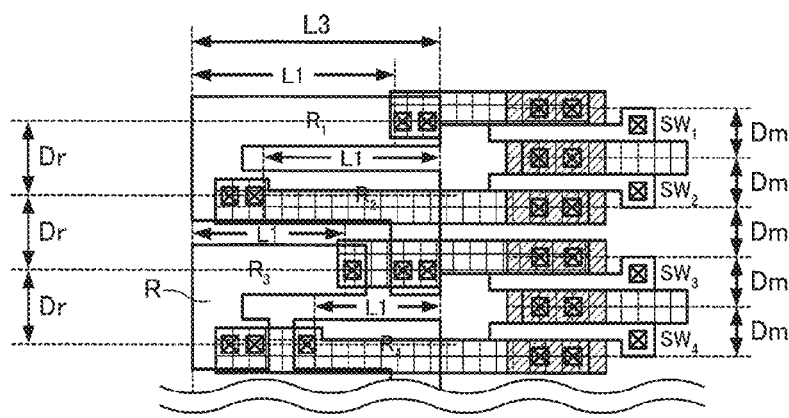
FIG. 7 is a diagram illustrating one example of a layout of a D/A conversion circuit in a modification example.

Furthermore, for example, according to the first embodiment described above, as illustrated in FIG. 7, although the resistive element R is divided into a plurality of portions, the contacts are connected to each other with wiring, and thus the meandering type resistors are realized, in the meandering type resistor, the numbers of contacts and the positions of the contacts in the second direction are made to be unequal to each other and so on, and thus the shortest lengths L1 in the second direction between the end of the contact and the end of the resistive element R may be unequal to each other.

Furthermore, for example, according to the second embodiment described above, the D/A conversion circuit that has the nonlinear input and output characteristic only in the straight line-type resistor is realized, but the D/A conversion circuit that has the nonlinear input and output characteristic only in the meandering type resistor can be realized.

2. Oscillator

Figure 8:
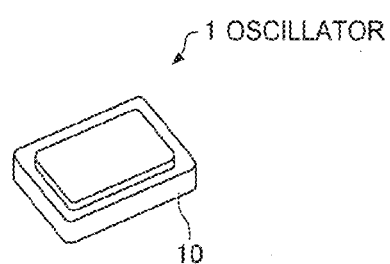
FIG. 8 is a perspective diagram illustrating an oscillator according to the present embodiment.
Figure 9:
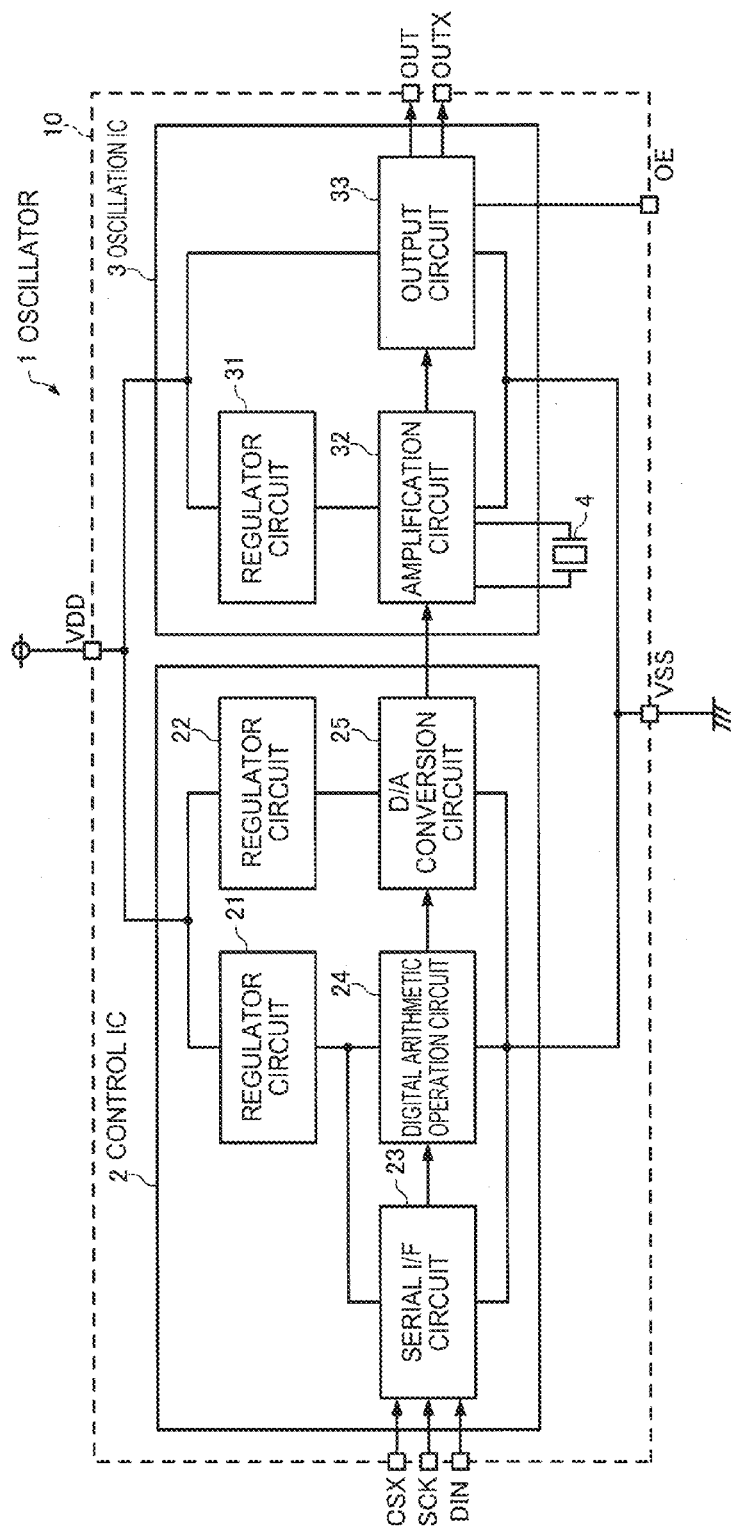
FIG. 9 is a diagram illustrating a configuration of the oscillator according to the present embodiment.

FIG. 8 is a perspective diagram illustrating the oscillator according to the present embodiment. Furthermore, FIG. 9 is a diagram illustrating a configuration of the oscillator according to the present embodiment. The oscillator 1 according to the present embodiment is a digital control oscillator in which control of an oscillation frequency is possible with a digital signal that is input from an external terminal. As illustrated in FIGS. 8 and 9, the oscillator 1 is configured to include a control integrated circuit (IC) 2, an oscillation integrated circuit (IC) 3, a quartz vibrator 4, and a package (container) 10 into which the control IC2, and the oscillation IC3, and the quartz vibrator 4 are to be mounted.

For operation of the control IC2, a power source potential VDD is supplied from a power source terminal VDD of the oscillator 1 to a power source terminal of the control IC2, and a ground potential VSS is supplied from a ground terminal GND to a ground terminal of the control IC2. In the same manner, for operation of the oscillation IC3, the power source potential VDD is supplied from the power source terminal VDD of the oscillator 1 to a power source terminal of the oscillation control IC3, and the ground potential VSS is supplied from the ground terminal GND to a ground terminal of the oscillation IC3.

The control IC2, as illustrated in FIG. 9, is configured to include a regulator circuit 21, a regulator circuit 22, a serial interface circuit 23, a digital arithmetic operation circuit 24 and a D/A conversion circuit (digital to analog converter (DAC)) 25.

The regulator circuit 21 is a voltage regulator that generates a constant voltage from the power source potential VDD, and supplies the generated constant voltage to the serial interface circuit 23 and the digital arithmetic operation circuit 24.

The regulator circuit 22 is a voltage regulator that generates a constant voltage from the power source potential VDD and supplies the generated constant voltage to a power source node of the D/A conversion circuit 25, or is an electric current regulator that generates a constant electric current from the power source potential VDD and supplies the generated constant electric current to a power source node of the D/A conversion circuit 25.

The serial interface circuit 23 receives a chip selection signal, a serial data signal, and a clock signal that are input from three external terminals CSX, SCK, and DAIN, respectively, of the oscillator 1, through three terminals of the control IC2, synchronizes the received signals to a clock signal when the chip selection signal is active, acquires a serial data signal and outputs the acquired serial data signal to the digital arithmetic operation circuit 24. The serial interface circuit 23, for example, may be an interface circuit that supports a serial peripheral interface (SPI) bus. Moreover, according to the present embodiment, the serial interface circuit 23 is a three-wire interface circuit, but is not limited to this. For example, the serial interface circuit 23 may be a two-wire interface circuit that supports an $I^2C$ (inter-integrated circuit) bus.

The digital arithmetic operation circuit 24 converts the serial data signal that is output by the serial interface circuit 23 into an N-bit data signal, and outputs the N-bit data signal.

The D/A conversion circuit 25 converts the N-bit data signal that is output by the digital arithmetic operation circuit 24 into an analog signal, and thus generates a control signal for controlling the control IC3 and outputs the generated control signal from a terminal of the control IC2. Moreover, an output terminal of the D/A conversion circuit 25 and a control terminal (an input terminal for the control signal) of the oscillation IC3 may be connected to each other through a passive element such as a resistance or a capacitor.

The oscillation IC3 is connected to a quartz vibrator 4, causes the quartz vibrator 4 to resonate with a frequency in accordance with a control signal that is output by the control IC2, and outputs an oscillation signal. The oscillation signal is output, as a differential oscillation signal, to the outside of the oscillator 1 through two external terminals OUT and OUTX of the oscillator 1. Furthermore, the oscillation IC3 controls a resonance frequency of the quartz vibrator 4 based on control by the control IC2. Moreover, the quartz vibrator 4 is one example of a resonator, and in place of the quartz vibrator 4, a different resonator may be used. The resonator may be an electro resonance circuit, and may be an electro mechanical resonator or the like. The resonator, for example, may be a vibrator. The vibrator, for example, may be a piezoelectric vibrator, a surface acoustic wave (SAW) resonator, a micro electro mechanical systems (MEMS) vibrator or the like. Furthermore, as a substrate material of the vibrator, a piezoelectric material, such as piezoelectric ceramic such as lead zirconate titanate, or piezoelectric single crystal such as quartz, lithium tantalate, or lithium niobate, or a silicon semiconductor material, can be used. As an excitation means of the vibrator, what results from a piezoelectric effect may be used, and electrostatic drive that results from Coulomb force may be used. Furthermore, the resonator may be an optical resonator that uses light which interacts with a gas cell that has an alkali metal or the like inside and with an atom of an alkali metal or the like, a cavity resonator or a dielectric resonator that resonates in a microwave range, an LC resonator, or the like.

Moreover, only one pair (a pair of the power source terminal VDD to which the power potential VDD is supplied and the ground terminal GND to which the ground potential VSS is supplied, in FIG. 9) of external power source terminals of the oscillator 1 may be sufficient. With this configuration, the oscillator 1 can be miniaturized, and if only a power source voltage for one system is supplied to the oscillator 1, the oscillation signal can be output. For this reason, the oscillator 1 can be used as a clock source of a system. However, the oscillator 1 according to the present embodiment may include a pair (a pair of power source terminals for the control IC2 and a pair of power source terminals for the oscillation IC3) of external power source terminals for two or more systems.

As illustrated in FIG. 9, the oscillation IC3 is configured to include a regulator circuit 31, an amplification circuit 32, and an output circuit 33.

The regulator circuit 31 is an electric current regulator that generates a constant electric current from the power source potential VDD and supplies the generated constant electric current to a power source node of an amplification circuit 32, or a voltage regulator that generates a constant voltage from the power source potential VDD and supplies the generated constant voltage to the amplification circuit 32.

The amplification circuit 32, for example, amplifies a signal that is output from the quartz vibrator 4, with a bipolar transistor that operates on an electric current which is supplied from the regulator circuit 31, and causes the quartz vibrator 4 to resonate by feeding the amplified signal back to the quartz vibrator 4. Alternatively, the amplification circuit 32 amplifies the signal that is output from the quartz vibrator 4, with a CMOS inverter element that operates on a voltage that is supplied from the regulator circuit 31, and may cause the quartz vibrator 4 to resonate by feeding the amplified signal back to the quartz vibrator 4.

The amplification circuit 32 has a variable capacitance element which is not illustrated (for example, a variable capacitance diode, MOS capacitance, or the like) that functions as load capacitance of the quartz vibrator 4. A voltage (a control voltage) of the control signal that is output from the control IC2 is applied to the variable capacitance element through a terminal (a control terminal) of the oscillation IC3, and a capacitance value of the variable capacitance element is controlled by the control voltage. Then, an oscillation frequency of the quartz vibrator 4 changes according to the capacitance value of the variable capacitance element.

Moreover, for example, various oscillation circuits, such as a pierce oscillation circuit, an inverter-type oscillation circuit, a Colpitts oscillation circuit, and a Hartley oscillation circuit, may be configured from the amplification circuit 32 and the quartz vibrator 4.

The output circuit 33, for example, buffers or level-shifts a signal (an input signal of the quartz vibrator 4) that is amplified by the amplification circuit 32, and generates and outputs an oscillation signal. The output circuit 33, for example, generates a differential oscillation signal in accordance with any one of specifications, such as low-voltage positive emitter coupled logic (LVPECL), low-voltage differential signals (LVDS), and high-speed current steering logic (HCSL). Then, the output circuit 33 outputs an oscillation signal from two terminals of the oscillation IC3 when an external terminal OE is at a high (H) level, and stops the output of the oscillation signal when the external terminal OE is at a low (L) level. The differential oscillation signal that is output from the oscillation IC3 is output from the two external terminals OUT and OUTX of the oscillator 1 to the outside. Moreover, the output circuit 33 may generate a single-end oscillation signal such as a CMOS-level oscillation signal, and may output the generated single-end oscillation signal from the external terminal OUT to the outside. In this case, the external terminal OUTX is unnecessary.

The amplification circuit 32 functions as, or the amplification circuit 32 and the output circuit 33 function as an oscillation circuit for causing the quartz vibrator 4 to resonate.

Figure 10:
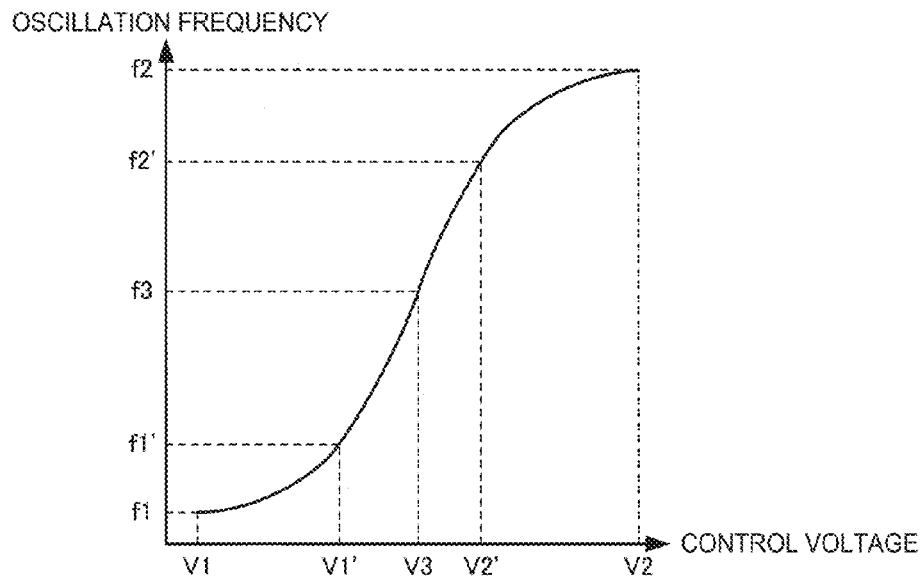
FIG. 10 is a diagram illustrating one example of a relationship between a control voltage and an oscillation frequency according to the present embodiment.

The oscillation circuit that is configured from the oscillation IC3 and the quartz vibrator 4 functions as a voltage controlled crystal oscillation circuit that outputs an oscillation signal with a frequency in accordance with the voltage (the control voltage) (a voltage between terminals of the variable capacitance element) of the control signal that is output by the control IC2. FIG. 10 illustrates one example of a relationship (a control voltage-oscillation frequency characteristic) between a control voltage (a voltage between terminals of the variable capacitance diode) and an oscillation frequency (a frequency of the oscillation signal) in a case where the variable capacitance diode is used as the variable capacitance element. In FIG. 10, the horizontal axis indicates the control voltage and the vertical axis indicates the oscillation frequency. As illustrated in FIG. 10, as the control voltage changes from V1 to V2, the oscillation frequency changes in a nonlinear manner from f1 to f2. Specifically, as the control voltage changes from V1 to V3, a slope (a change rate) of the oscillation frequency increases monotonously, and as the control voltage changes from V3 to V2, the slope (the change rate) of the oscillation frequency decreases monotonously. This nonlinearity of the control voltage-oscillation frequency characteristic is, in most cases, due to the fact that a relationship between the voltage of the terminals of the variable capacitance diode and the capacitance value is nonlinear.

Generally, because linearity of the oscillation frequency is stipulated in an oscillation specification (for example, approximately 5 ppm/V), in a case where the control voltage-oscillation frequency characteristic of the oscillation circuit is nonlinear, a full range (for example, a range from V1 to V2 in FIG. 10) of the control voltage cannot be used, and, in the related art, only a reduced range (for example, a range from V1' to V2' in FIG. 10) in which the linearity is good can be used. In this manner, a variable range of the oscillation frequency is limited.

Figure 11:
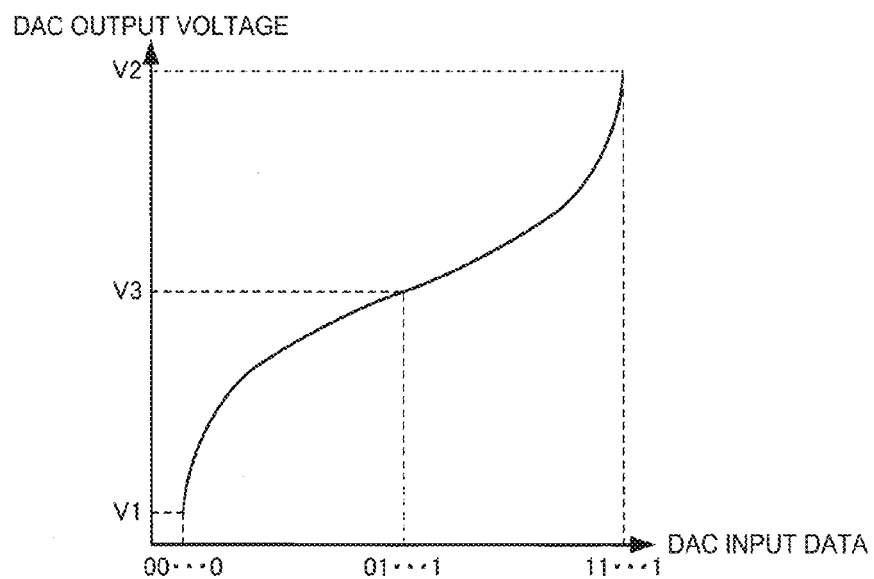
FIG. 11 is a diagram illustrating one example of an input and output characteristic of the D/A conversion circuit according to the present embodiment.

Accordingly, according to the present embodiment, in order to broaden the variable range of the oscillation frequency, an input and output characteristic of the D/A conversion circuit 25 is adjusted in such a manner as to have nonlinearity in the direction of offsetting the nonlinearity of the control voltage-oscillation frequency characteristic of the oscillation circuit. FIG. 11 illustrates one example of the input and output characteristic of the D/A conversion circuit 25. In FIG. 11, the horizontal axis indicates an input code (an N-bit data signal value) of the D/A conversion circuit 25, and the vertical axis indicates an output voltage (a control voltage) of the D/A conversion circuit 25. As illustrated in FIG. 11, as the input code changes from 00 . . . 0 to 11 . . . 1, the output voltage changes in a nonlinear manner from V1 to V2. Specifically, as the input code changes from 00 . . . 0 to 01 . . . 1, the slope (the change rate) of the output voltage decreases monotonously, and as the input code changes from 01 . . . 1 to 11 . . . 1, the slope (the change rate) of the output voltage increases monotonously.

Figure 12:
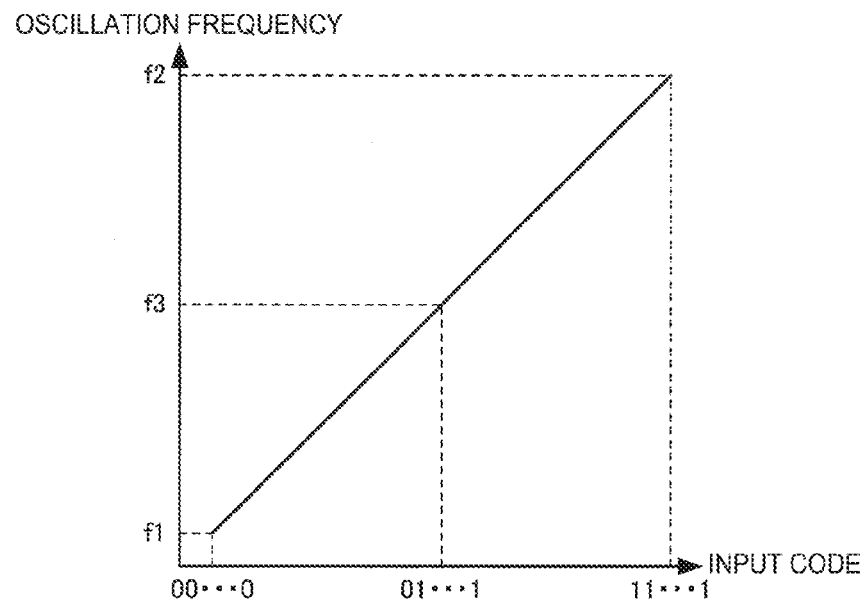
FIG. 12 is a diagram illustrating one example of an input and output characteristic of an oscillator according to the present embodiment.

Therefore, nonlinearity of the input and output characteristic of the D/A conversion circuit 25 and nonlinearity of the control voltage-oscillation frequency characteristic of the oscillation circuit are mutually offset, and an input and output characteristic of the oscillator 1 is close to linearity. FIG. 12 illustrates the input and output characteristic of the oscillator 1 in a case where the oscillation circuit has the control voltage-oscillation frequency characteristic that is illustrated in FIG. 10 and the D/A conversion circuit 25 has an input and output characteristic that is illustrated in FIG. 11. In FIG. 12, the horizontal axis indicates the input code (the N-bit data signal value), and the vertical axis indicates the oscillation frequency. As illustrated in FIG. 12, as the input code changes from 00 . . . 0 to 11 . . . 1, the oscillation frequency changes in a linear manner from V1 to V2. In this manner, because the full range of the control voltage (for example, the range from V1 to V2 in FIG. 12) can be used corresponding to a full range of the input code, the oscillator 1 can more broaden the variable range of the oscillation frequency than in the related art.

As the D/A conversion circuit 25 that has the nonlinearity in terms of the input and output characteristic, for example, the D/A conversion circuit 100 according to each of the embodiments, which are described above, or the D/A conversion circuit 100 in each of the modification examples, which are described above, are applied, and thus the small-sized digital control-type oscillator 1 can be realized that has a wide frequency variable range.

3. Electronic Apparatus

Figure 13:
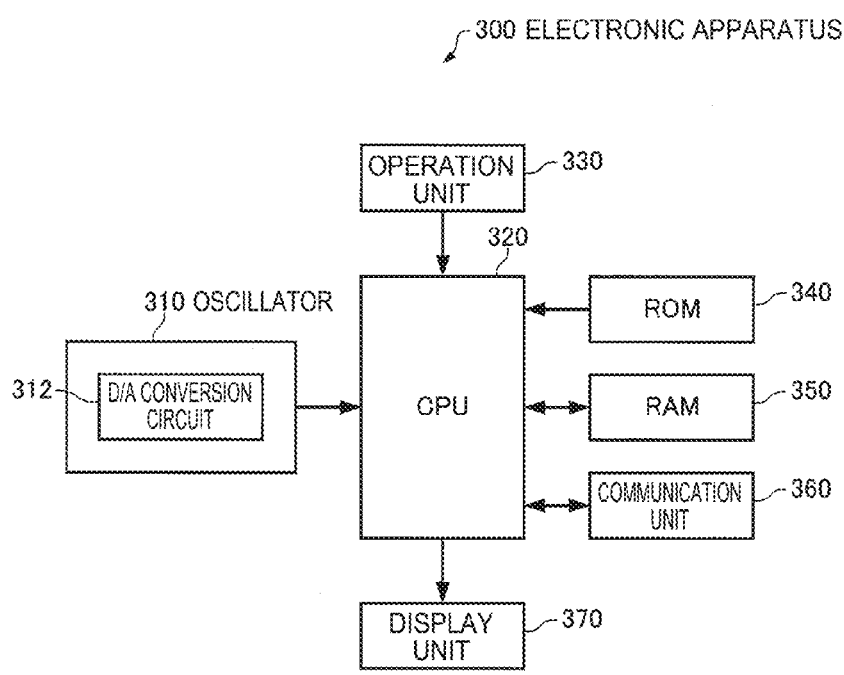
FIG. 13 is a block diagram illustrating one example of a configuration of an electronic apparatus according to the present embodiment.

FIG. 13 is a functional block diagram illustrating one example of a configuration of an electronic apparatus according to the present embodiment. An electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. Moreover, the electronic apparatus according to the present embodiment may have a configuration that results from omitting or changing one or several of the constituent elements (units) in FIG. 13, or may have a configuration that results from adding a different constituent element to the constituent elements in FIG. 13.

The oscillator 310 has a resonator (not illustrated), an oscillation circuit (not illustrated) that causes the resonator to resonate, and a D/A conversion circuit 312 for controlling the oscillation circuit, built in, and outputs an oscillation signal due to the resonance by the resonator. The oscillation signal is supplied from the oscillator 310 to the CPU 320.

The CPU 320 performs various computing processing operations or control processing operations, with an oscillation signal input from the oscillator 310 as a clock signal, according to a program that is stored in the ROM 340 or the like. Specifically, the CPU 320 performs various processing operations in accordance with an operation signal from an operation unit 330, processing that controls the communication unit 360 for performing data communication with an external device, processing that transmits a display signal for displaying various pieces of information on the display unit 370, and the like.

The operation unit 330 is an input device that is configured from operation keys, buttons, and the like, and outputs the operation signal in accordance with a user operation to the CPU 320.

A program, data, and the like that are necessary for the CPU 320 to perform various computing processing operations or control processing operations are stored in the ROM 340.

The RAM 350 is used as a working area for the CPU 320, and the program or the data that is read from the ROM 340, data that is input from the operation unit 330, a result of arithmetic operation that is performed by the CPU 320 according to various programs, or the like is stored temporarily in the RAM 350.

The communication unit 360 performs various control operations for establishing data communication between the CPU 320 and an external device.

The display unit 370 is a display device that is configured as a liquid crystal display (LCD) or the like, and various pieces of information are displayed on the display unit 370, based on the display signal that is input from the CPU 320.

A touch panel that functions as the operation unit 330 may be provided on the display unit 370.

As the D/A conversion circuit 312, for example, the D/A conversion circuit 100 described above according to each of the embodiments described above or the D/A conversion circuit 100 described above in each of the modification examples described above are applied. Thus, the electronic apparatus that has high reliability can be realized at a low cost.

Various electronic apparatuses are considered as the electronic apparatus 300. As examples of these, there are a personal computer (for example, a mobile type personal computer, a laptop type personal computer, or a tablet type personal computer), a mobile terminal such as a smartphone or a portable telephone, a digital camera, an inkjet type discharge device (for example, an inkjet printer), a digital phase locked loop (PLL), a communication network device (for example, a storage area network device such as a router or a switch, or a local area network device), a device for a mobile terminal station, a television set, a video camera, a video recorder, a car navigation device, a real time clock device, a pager, an electronic organizer (including an electronic organizer equipped with a communication function), an electronic dictionary, a calculator, an electronic game device, a game controller, a word processor, a workstation, a television telephone, a crime prevention television monitor, an electronic binocular, a POS terminal, medical apparatuses (for example, an electronic thermometer, a manometer, a blood sugar meter, an electrocardiogram measurement apparatus, a ultrasonic diagnostic apparatus, and electronic endoscopy), a fish detector, various measurement apparatuses, meters (for example, meters for a vehicle, an airplane, and a ship), a flight simulator, a head-mounted display, motion trace, motion tracking, a motion controller, a pedestrian dead reckoning (PDR), and the like.

One example of the electronic apparatus 300 according to the present embodiment is a transmission device that functions as a terminal base station device that performs communication with a terminal in a wired or wireless manner, using the oscillator 310 as a reference signal source, a voltage-controlled oscillator (VCO), or the like. The electronic apparatus 300 according to the present embodiment can also be applied to a transmission apparatus that desirably has high performance and high reliability and that is available, for example, for use in a communication base station, for example, by applying the oscillator 1 described above according to each of the embodiments that includes the D/A conversion circuit 100 described above according to each of the embodiments or the D/A conversion circuit 100 described above in each of the modification examples, as the oscillator 310.

4. Moving Object

Figure 14:
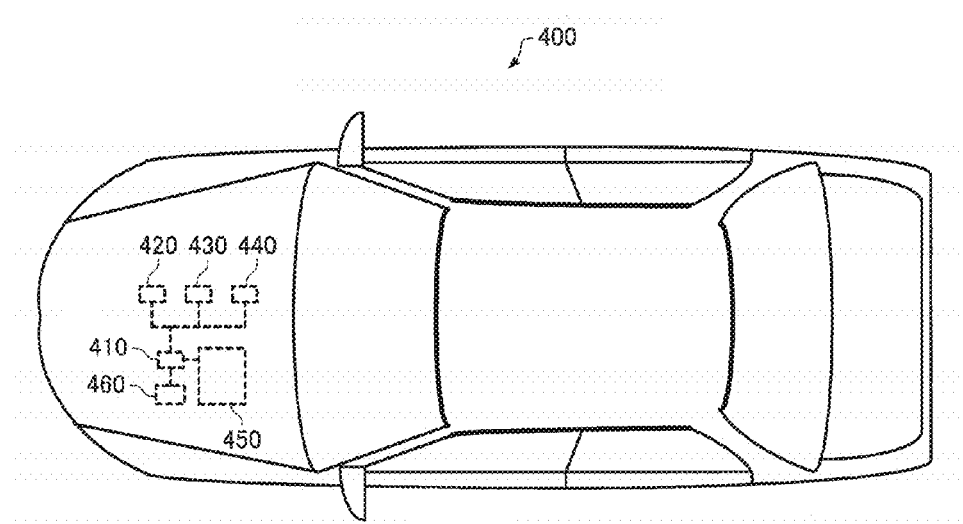
FIG. 14 is a diagram illustrating one example of a moving object according to the present embodiment.

FIG. 14 is a diagram (a top view) illustrating one example of a moving object according to the present embodiment. A moving object 400 that is illustrated in FIG. 14 is configured to include an oscillator 410 and controllers 420, 430, and 440 that perform various control operations such as an engine system, a brake system, and a keyless entry system, a battery 450, and a backup battery 460. Moreover, the moving object according to the present embodiment may have a configuration that results from omitting one or several of the constituent elements (units) in FIG. 14, or may have a configuration that results from adding a different element to the constituent elements in FIG. 14.

The oscillator 410 has a resonator (not illustrated), an oscillation circuit (not illustrated) that causes the resonator to resonate, and a D/A conversion circuit for controlling the oscillation circuit, built in, and outputs an oscillation signal due to the resonance by the resonator. The oscillation signal is supplied from the oscillator 410 to the controllers 420, 430, and 440, and for example, is used as a clock signal.

The battery 450 supplies electric power to the oscillator 410 and the controllers 420, 430, and 440. The backup battery 460 supplies electric power to the oscillator 410 and the controllers 420, 430, and 440 when an output voltage of the battery 450 falls below a threshold.

As the D/A conversion circuit that is built into the oscillator 410, for example, the D/A conversion circuit 100 described above according to each of the embodiments described above or the D/A conversion circuit 100 described above in each of the modification examples described above are applied. Thus, the moving object that has high reliability can be realized at a low cost.

As the moving object 400, various movable bodies are considered. As examples of these, there are vehicles (also including an electric car), airplanes such as a jet or a helicopter, ships, rockets, and satellites.

The invention is not limited to the present embodiment, and it is possible to make various modifications within the scope of the gist of the invention.

The embodiments and the modification examples, which are described above, are examples, and the invention is not limited to these. For example, suitable combinations of the embodiments and the modification examples are also possible.

The invention includes substantially the same configuration (for example, a configuration that has the same function, the same way, and the same result or that has the same effect) as described according to each of the embodiments. Furthermore, the invention includes a configuration in which a unsubstantial portion of the configuration that is described according to each of the embodiment is replaced. Furthermore, the invention includes a configuration that achieves the same operational effect as the configuration that is described according to each of the embodiments, or a configuration that can accomplish the same object. Furthermore, the invention includes a configuration that results from adding a known technology to the configuration that is described according to each of the embodiments.

The entire disclosure of Japanese Patent Application No. 2015-020198, filed Feb. 4, 2015 is expressly incorporated by reference herein.

What is claimed is:

1. A D/A conversion circuit comprising:
a plurality of resistors that are connected in series to each other; and
a plurality of switches that are respectively connected to the plurality of resistors,
the plurality of resistors and the plurality of switches being formed on a semiconductor substrate,
wherein each of the plurality of resistors is configured using a resistive element and a plurality of contacts that are provided to the resistive element,
wherein, when the semiconductor substrate is viewed from above,
the plurality of switches are arranged side by side along a first direction,
distances in the first direction between the plurality of contacts are equal to each other, and
lengths in a second direction that is perpendicular to the first direction, of the plurality of resistors are unequal to each other, and
wherein both ends of each of the plurality of resistors are to be the contact that is connected to an electrode of one switch of the two switches which are arranged adjacent to each other, and the contact that is connected to an electrode of the other switch.

2. The D/A conversion circuit according to claim 1, wherein each of the plurality of switches is a MOS transistor.

3. An oscillator comprising:
the D/A conversion circuit according to claim 2.

4. An electronic apparatus comprising:
the D/A conversion circuit according to claim 2.

5. A moving object comprising:
the D/A conversion circuit according to claim 2.

6. An oscillator comprising:
the D/A conversion circuit according to claim 1.

7. An electronic apparatus comprising:
the D/A conversion circuit according to claim 1.

8. A moving object comprising:
the D/A conversion circuit according to claim 1.

9. The D/A conversion circuit according to claim 1, the plurality of resistors are continuously and directly connected in series to each other.

10. A D/A conversion circuit comprising:
a plurality of resistors that are connected in series to each other; and
a plurality of switches that are respectively connected to the plurality of resistors, the plurality of resistors and the plurality of switches being formed on a semiconductor substrate,
wherein each of the plurality of resistors is configured using a resistive element and a plurality of contacts that are provided to the resistive element,
wherein, when the semiconductor substrate is viewed from above, the plurality of switches are arranged side by side along a first direction,
distances in the first direction between the plurality of contacts are equal to each other, and
lengths in a second direction, which is perpendicular to the first direction, of the plurality of resistors are unequal to each other, and
wherein when the semiconductor substrate is viewed from above, at least one of the plurality of resistors is a first type resistor that has bending, and at least another one of the plurality of resistors is a second type resistor that has no bending.

11. The D/A conversion circuit according to claim 10, wherein, when the semiconductor substrate is viewed from above, if a length in the second direction, of a resistor that, among the first type resistors, has a maximum resistance value is set to $L1_{max}$ and a length in the second direction, of a resistor that, among the second type resistors, has a minimum resistance value is set to $W2_{max}$, $0.5 \leq L1_{max}/W2_{max} \leq 2$ is established.

12. An oscillator comprising:
the D/A conversion circuit according to claim 11.

13. An electronic apparatus comprising:
the D/A conversion circuit according to claim 11.

14. The D/A conversion circuit according to claim 11, the plurality of resistors are continuously and directly connected in series to each other.

15. An oscillator comprising:
the D/A conversion circuit according to claim 10.

16. An electronic apparatus comprising:
the D/A conversion circuit according to claim 10.

17. A moving object comprising:
the D/A conversion circuit according to claim 10.

18. The D/A conversion circuit according to claim 10,
the plurality of resistors are continuously and directly connected in series to each other.

19. A D/A conversion circuit comprising:
a plurality of resistors that are connected in series to each other; and
a plurality of switches that are respectively connected to the plurality of resistors, the plurality of resistors and the plurality of switches being formed on a semiconductor substrate,
wherein each of the plurality of resistors is configured using a resistive element and a plurality of contacts that are provided to the resistive element,
wherein, when the semiconductor substrate is viewed from above, the plurality of switches are arranged side by side along a first direction,
distances in the first direction between the plurality of contacts are equal to each other, and
lengths in a second direction, which is perpendicular to the first direction, of the plurality of resistors are unequal to each other, and
wherein, when the semiconductor substrate is viewed from above, each of the plurality of resistors is a resistor that has no bending.

20. The D/A conversion circuit according to claim 19,
the plurality of resistors are continuously and directly connected in series to each other.

* * * * *